United States Patent [19]

Pease et al.

[11] Patent Number: 5,135,609

[45] Date of Patent: Aug. 4, 1992

[54] QUANTUM LITHOGRAPHY MASK AND FABRICATION METHOD

[75] Inventors: R. Fabian W. Pease; Nadim I. Maluf, both of Stanford, Calif.

[73] Assignee: The Board of Trustees of the Leland Stanford Junior University, Stanford, Calif.

[21] Appl. No.: 549,187

[22] Filed: Jul. 6, 1990

[51] Int. Cl.$^5$ ............................................. B44C 1/22
[52] U.S. Cl. .................................. 156/654; 156/655; 156/656; 156/659.1; 156/664; 430/5; 378/35; 427/256
[58] Field of Search ................... 156/655, 656, 659.1, 156/664, 654; 430/5; 378/35; 437/948; 148/DIG. 102–DIG. 106; 427/160, 256, 267, 271, 272, 274, 280, 282

[56] References Cited

U.S. PATENT DOCUMENTS 4,199,358 4/1980 Parsons ........................... 156/659.1
4,738,746 4/1988 Clariou ............................. 156/631

OTHER PUBLICATIONS

T. A. Fulton & G. J. Dolan, "New approach to electron beam lithography", Appl. Phys. Lett., vol. 42(8), Apr. 15, 1983.

*Primary Examiner*—Thi Dang
*Attorney, Agent, or Firm*—Flehr, Hohbach, Test, Albritton & Herbert

[57] ABSTRACT

Thin film masks with precisely located and positioned features are manufactured using a methodology herein called quantum lithography. A thin film layer, such as a chromium film, is deposited on a substrate such as quartz glass. Then, a set of precisely located dividing lines is defined in the thin film layer. The dividing lines are spaced in accordance with a predefined coordinate system and intersect so as to define tiles between the dividing lines. An electron beam pattern generator may be used to generate a large number of identical masks having a thin film with precisely located dividing lines. These masks will each be customized by subsequent processing steps. Each such mask is customized by selectively identifying a subset of the tiles and removing the selected subset of tiles to form a mask pattern in the thin film layer. The resulting pattern has very precisely located edges because the edges correspond to dividing lines formed using a precision patterning system, such an electron beam pattern generator. However, the actual light blocking pattern of the mask can be defined using a much lower accuracy pattern generator. An alternate embodiment of the invention uses a quantized additive process. A set of precisely located boundary lines are formed on a substrate to form a generic mask. The generic mask is customized by removing a subset of the boundary lines, and then selectively depositing a masking material inside the closed regions defined by the remaining boundary lines.

11 Claims, 6 Drawing Sheets

QUANTUM LITHOGRAPHY MASK AND FABRICATION METHOD

This invention was made with United States Government support under Navy Contract No. N00014-88-K-0701. As a result, the United States Government has certain rights in this invention.

The present invention relates generally to patterning thin films and forming precision mask patterns, and particularly to a set of related methods and systems for using inexpensive, low resolution equipment to generate high precision patterned thin films.

BACKGROUND OF THE INVENTION

The preferred embodiment of the present provides a low cost method of producing chromium masks (used in the manufacture of integrated circuits) using a methodology herein called "quantum lithography," a term coined by the inventors of the present invention. It should be understood, however, that the methodology of quantum lithography is applicable to any masking or patterning task requiring feature edges that are positioned with high accuracy.

As integrated circuit fabrication techniques become more sophisticated, feature sizes become ever smaller. Manufacturing integrated circuits requires the use of several overlapping layers of masks which must be precisely positioned relative to each other to form the structure. The positional accuracy of placement of the features on each integrated circuit mask is also extremely important.

To make masks acceptable for use in manufacture of integrated circuits which meet the state of the art standards, especially the positional accuracy requirements, prior art system use scanning electron beam pattern generators. These state of the art machines use interferometers to precisely position the workpiece supporting the mask blank and scan the workpiece with an electron beam in raster fashion. The electron beam is turned on and off to expose an electron sensitive resist layer over a layer of chromium so as to define the size, shape and position of the features to be fabricated.

Such electron beam pattern generators are very expensive. Further, they must be employed in precisely controlled environments where temperature and humidity are controlled to very tight tolerances. Typically temperature must be controlled to plus or minus 0.1° C. Particulates in the air must also be eliminated or substantially reduced. Such operational environments are very expensive to build and maintain.

Integrated circuits (hereinafter sometimes also referred to as chips or dies) are designed for many different purposes. The number of such circuits built depends upon the application for which the circuit is designed. For example, for a memory chip, millions may be built whereas an exotic microwave integrated circuit may have only a few hundred built. The microwave chip will however require the same or greater precision in feature size and positional accuracy as the memory chip. Since the cost to make a chip is related to the number made, it is apparent that making chips which require state of the art feature sizes and positional accuracy becomes impractical when a low volume of chips are to be made.

More generally, there is a large market for low volume, application specific integrated circuits (ASICs), many of which require state of the art circuit feature sizes and positional accuracy.

Most prior art integrate circuit processing systems use 5× reticles (the terms reticles and masks are used interchangeably herein). This means that the feature sizes on the mask will be reduced in size by a factor of five during projection of the mask image on the die. As feature sizes become smaller and approach 0.25 microns, aberrations in the optics of the stepper machines used to project the image of the mask onto the die will prevent 5× reduction from being used. In such processes 1× reticles or masks will have to be fabricated. 1× reticles have feature sizes and positional accuracy identical to that which will be in the final product because no magnification or demagnification is used projecting the mask image onto the wafer. Thus, while prior art 5× masks could be defined using pattern generators with minimum feature sizes five times larger than the minimum feature sizes on the corresponding integrated circuits, in the near future 1× masks will be required with minimum feature sizes equal to the minimum feature sizes on the corresponding integrated circuits. Thus there will be a need for pattern generation equipment and methods which generate masks with dramatically smaller minimum features and which require dramatically better positional accuracy than has been required heretofore.

Accordingly, a need has arisen for a process of making integrated circuit masks whereby state of the art feature sizes and positional accuracy may be achieved, but which is also practical for use in making masks for low production volume chips.

SUMMARY OF THE INVENTION

In summary, the present invention generates thin film patterns with precisely located and positioned features using a methodology herein called quantum lithography. The process begins with depositing a thin film layer on a substrate. For example a layer of chromium may be deposited on a glass plate, known as a glass mask blank. Then, a set of precisely located dividing lines are defined in the thin film layer. The dividing lines are spaced in accordance with a predefined coordinate system (such as Cartesian or polar coordinates) and intersect so as to define tiles between the dividing lines. An electron beam pattern generator may be used to generate a large number of identical masks having a thin film with precisely located dividing lines. These masks will each be customized by subsequent processing steps.

Each such mask is customized by selectively identifying a subset of the tiles and removing the selected subset of tiles to form a mask pattern in the thin film layer. The resulting pattern has very precisely located edges because the edges correspond to dividing lines formed using a precision patterning system, such an electron beam pattern generator. However, the actual light blocking pattern of the mask can be defined using a much lower accuracy pattern generator.

An alternate embodiment of the invention uses a quantized additive process for making a mask. In particular, the process begins by forming on a substrate a set of precisely located boundary lines, spaced in accordance with a predefined coordinate system and intersecting so as to define tiled regions between the boundary lines. This generic mask is customized by removing a subset of the boundary lines, and then selectively depositing a masking material inside the closed regions defined by the remaining boundary lines.

BRIEF DESCRIPTION OF THE DRAWINGS

Additional objects and features of the invention will be more readily apparent from the following detailed description and appended claims when taken in conjunction with the drawings, in which:

DETAILED DESCRIPTION OF THE PREFERRED EMBODIMENTS

Figure 1:
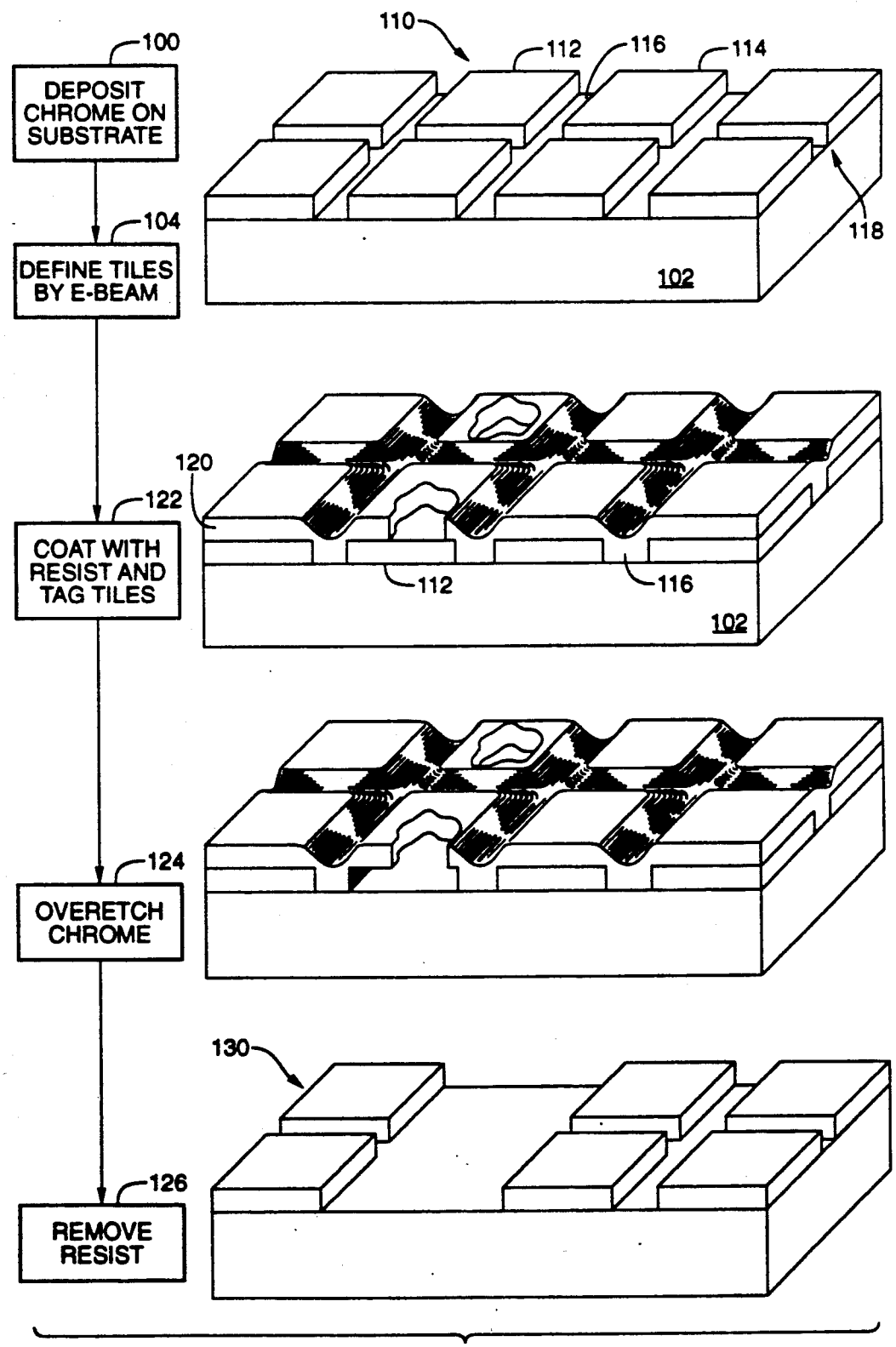
FIG. 1 is a conceptual depiction of the methodology of the present invention.

Referring to FIG. 1, the basic methodology of "quantum lithography" is as follows. The first step 100 of the process is to take a quartz mask blank 102 (herein called the substrate) and deposit a thin film (e.g., 800 angstroms) of chromium on it. Quartz mask blanks with a chromium film already deposited are commercially available.

Next, the thin film layer is coated with a layer of resist and then a high precision pattern generator, such as an interferometric type scanning electron beam pattern generator, is used to define an array of tiles separated by an intersecting set of regularly spaced dividing lines (step 104). Precision positioning of the dividing lines is essential, and therefore this step of the process will typically require the use of expensive pattern generators, such as E-beam pattern generators.

In the preferred embodiment, to generate so-called "1× masks" with a minimum feature dimension of 0.5 microns, the tiles will be 0.5 microns square, separated by dividing lines which are 0.1 microns wide or less. The width of the dividing lines must be less than the wavelength of the light which will be used when projecting the mask onto a semiconductor substrate, so that the dividing lines will not be imaged. Typically the light used for projecting the image of a mask onto a semiconductor wafer will have wavelengths in the range of 0.45 to 0.20 microns.

After the precision pattern generating step, one is left with a generic or master mask 110, which comprises an array of tiles 112, 114 separated by trenches 116, 118. In semiconductor applications, the tiles will typically be square or rectangular in shape. However, in other types of industrial applications which use radial or polar coordinates, the tiles will have different shapes. In all cases, it is expected that the dividing lines will be regularly spaced in accordance with a predefined coordinate system.

Each dividing line or trench 116, 118 is precisely positioned (to within 0.08 microns accuracy or better in the preferred embodiments) by a very accurate pattern generator. Likewise, by inference, each tile is also precisely positioned and its size is tightly controlled since the accurate pattern generator defines the positions and sizes of all the trenches and etching of the trenches defines the sizes and positions of all the tiles. Each trench 116, 118 is etched, preferably by an anisotropic etch, through the metal layer down to the glass substrate 102.

Large numbers of generic masks 110 can be manufactured at relatively low cost, despite the use of a high cost electron beam pattern generator, because thousands of copies of the exact same generic mask can be manufactured in an assembly line fashion. Whereas mask blank manufacturers now sell quartz mask blanks precoated with thin layers of chromium, these same manufacturers could sell "quantized" generic mask blanks. The only variations needed in mask patterns would be that a distinct tile pattern would be needed for each distinct minimum feature size. In other words, there would need to be a range of tile sizes, e.g., in steps of 0.1 or 0.05 microns, to allow for different minimum feature sizes.

The generic masks 110 are customized by each semiconductor manufacturer using a pattern generator with much lower positioning accuracy than the pattern generator used to manufacture the generic masks. Typically, the pattern generator used for creating generic masks will have two to five times greater positional accuracy than the pattern generator used for customization.

Customization is accomplished by coating the generic mask with resist 120, and then tagging the tiles that are to be removed (step 122). Tagging means that the resist located above selected tiles is removed. This can be accomplished by a narrow beam laser, or by a standard pattern generator (e.g., an electron beam pattern generator). The edges of the tagged regions or areas do not need to be precisely located, so long as the tagged areas are within the boundaries of the tiles to be removed.

After exposing portions of the tiles to be removed and developing the resist, the tiles so marked are removed by overetching (step 124). Typically this is done by etching in an appropriate etchant such as CR-14. The wet etchant enters through the holes in the resist and etches away the metal of the tile laterally until the etchant reaches the resist in the trenches around the tiles marked for removal. The etchant does not actually stop at the resist in the trenches, but it slows down substantially. Etching must be carried out for a time sufficient to ensure that lateral etching has completely removed the metal of the marked tiles without etching through the resist in the surrounding trenches.

Finally, the remaining resist is removed (step 126), leaving the customized mask 130. Therefore, each generic mask 110 can be customized using conventional or other low cost pattern generators. Note that the boundaries of each region defined by the resulting mask 130 are precisely located, e.g., to within 0.08 microns, because of the precision positioning of the tiles in the generic mask. Therefore the present invention provides a method of manufacturing very high precision masks, with high positional accuracy, at relatively low cost.

Trench Width and Projecting Light Wavelengths.

There is an interrelationship between the width of the trenches between tiles and the wavelength of the light used to project the image of the mask on a semiconductor wafer. In particular, the ratio of the wavelength of the light used to the numerical aperature of the optics should be selected so that the trenches in the mask are not imaged onto the die, while features the size of individual tiles are imaged onto the die. For most practical purposes, using modern optics, the effective width of the trenches, taking into account any demagnification of the mask while it is being projected onto a die, must be much smaller than the wavelength of the light being used to project of image of the mask onto the die. For example, if light having a wavelength of 436 nanometers (0.436 microns) is used to project the image of a 5× mask on a die with 0.25 micron trenches, the trenches will be unresolved, i.e., not visible, in the final image of the mask projected on the die. The reason that the final image will not contain images of the trenches is because 0.25 microns divided by 5 (for a 5× demagnification) is 0.05 microns which is much smaller than the wavelength (0.436 microns) of the light being projected through the mask. The diffraction limit of this light is approximately the same as the wavelength. If 436 nanometer light is shined through an aperture having an effective width of 0.05 microns, the light will be scattered, and the size and shape of the aperture will not appear in the final image. In another example, a 1× mask with 0.25 micron features and 0.05 micron trenches could be imaged with light having a wavelength of 248 nanometers.

It should be noted that even though a trench may not be imaged onto the die, a small amount of light may nevertheless be projected onto the region of the die corresponding the position of the trenches in the mask. This may result in partial removal of the resist during a processing step, creating a potential weak spot in the processing of semiconductor wafers. While this is only a potential problem which may never have any practical consequences, it may be noted that there is a simple solution. In particular, a selective metal deposition may be performed to fill in the trenches on the customized mask, for example, using an electroless metal deposition system. The metal deposition need only grow metal from the chromium tiles in the lateral direction equal to half the width of the trenches, since the metal will be deposited onto both sides of each trench. Since the trenches are very narrow to begin with, with a width that is smaller than the resolution limit of the optics being used, this metal deposition is very short in duration and does not materially affect the shapes in the customized mask pattern.

DETAILED DESCRIPTION OF A FIRST PREFERRED EMBODIMENT

Figure 2:
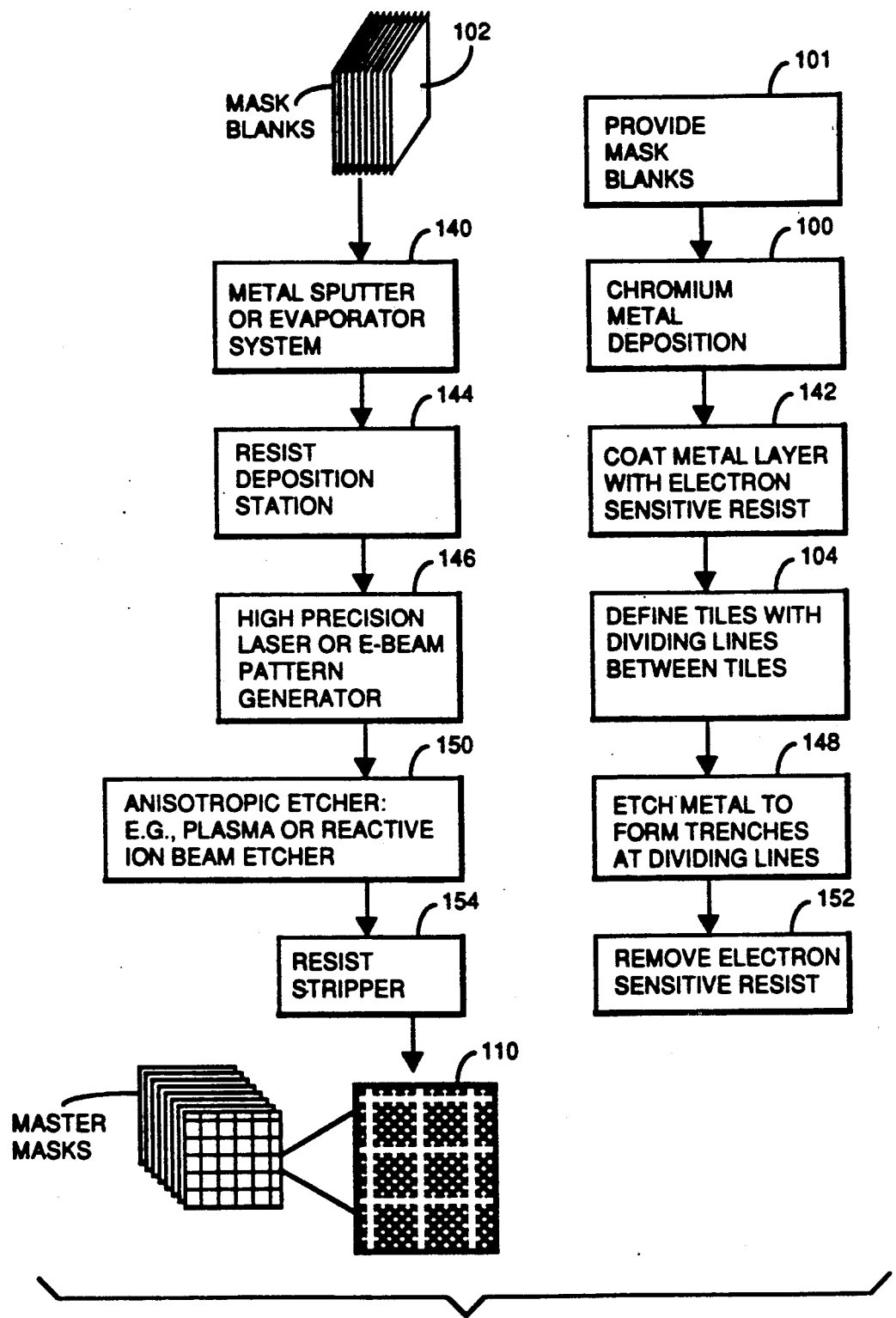
FIG. 2 is a combined flow chart and block diagram of a first embodiment of a system for manufacturing high precision generic masks.
Figure 3:
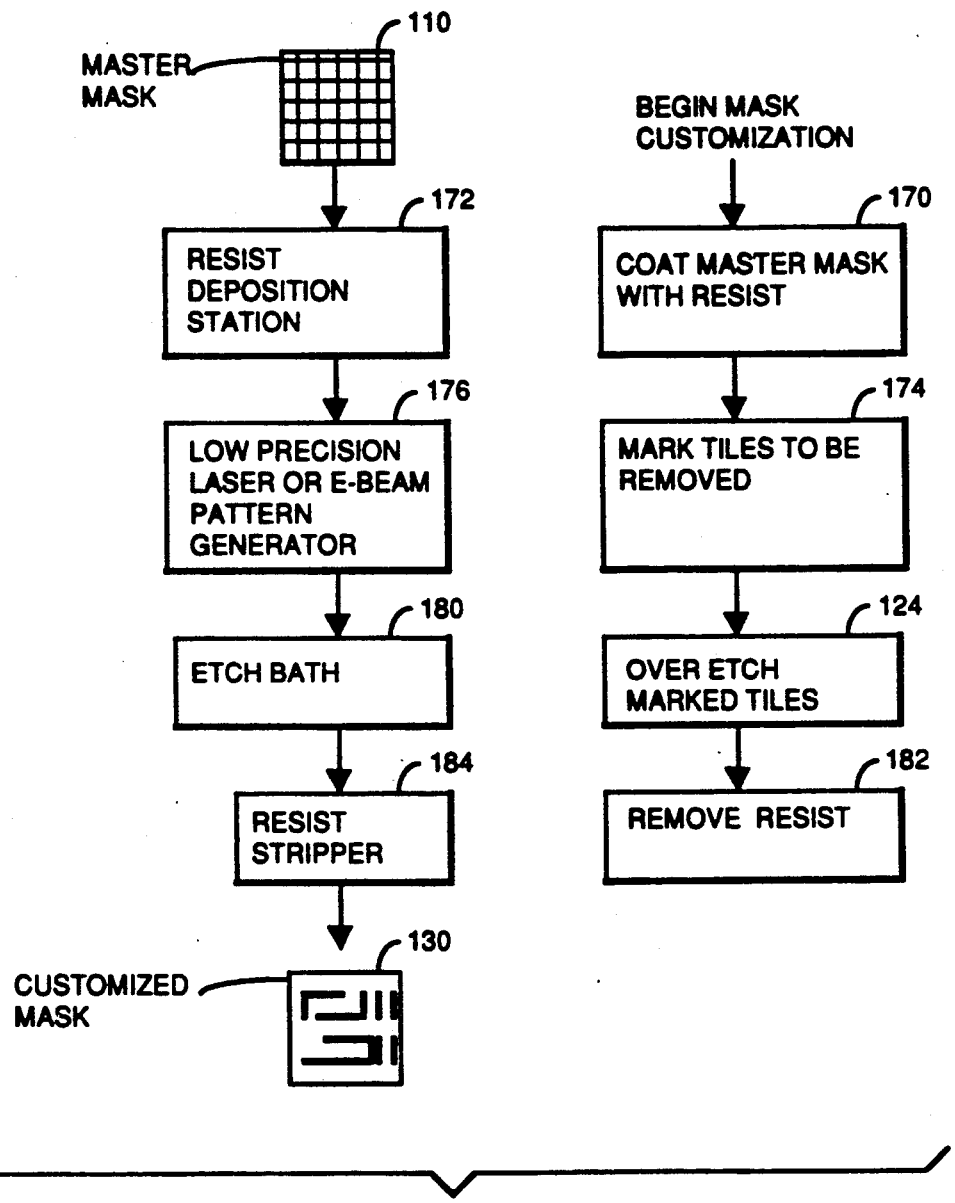
FIG. 3 is a combined flow chart and block diagram of a first embodiment of a system for customizing generic masks so as to generate custom masks.

Referring to FIGS. 2 and 3, the first preferred embodiment produces generic and customized mask patterns using the same methodology as described above with respect to FIG. 1. FIG. 2 shows details of one preferred embodiment for manufacturing generic master masks 110. Mask blanks are typically coated with a thin film of chromium (steps 101 and 100) in a metal evaporator system 140. Next, a positive electron sensitive resist is spun on (step 142) using a standard resist deposition station 144. As described above, tile definition (step 104) is performed by an interferometric type scanning electron beam pattern generator 146. After exposing the dividing lines to be removed from the chromium layer and developing the resist, trenches are formed by etching away the dividing lines (step 148) using an anisotropic etcher 150, such as a plasma or reactive beam ion etcher.

Finally, the electron sensitive resist is removed (step 152) using standard resist stripping chemicals and equipment 154. The resulting mask 110 is a generic master mask with precisely located tiles and trenches.

Referring to FIG. 3, customization of the generic master mask 110 begins by coating the mask with resist (step 170) at a resist deposition station 172. Note that the resist fills all the trenches in the generic mask, thereby separately surrounding or enveloping each of the tiles in the generic mask.

The customized mask pattern is defined by marking the tiles to be removed (step 174), typically using a laser or a low-precision electron beam pattern generator 176. Note that the laser or electron beam pattern generator 176 can be programmed simply to make a hole close the center of each tile to be removed, rather than having to expose the entire region of tiles to be removed. Thus the machine 176 used for this stage of the process need only have sufficient accuracy to expose the resist anywhere over each tile to be removed so as to define the custom pattern.

Next, the exposed tiles are overetched 124 in an etch bath 180, as described above, and then the remaining resist is removed (step 182) using standard resist stripping chemicals and equipment 184, leaving the customized mask 130. Note that unselected tiles remain unetched because they are completely surrounded by resist.

As described above, if necessary, a selective metal deposition may be performed at the end of the customization process in order to fill in the trenches between tiles.

DETAILED DESCRIPTION OF SECOND PREFERRED EMBODIMENT

Figure 4:
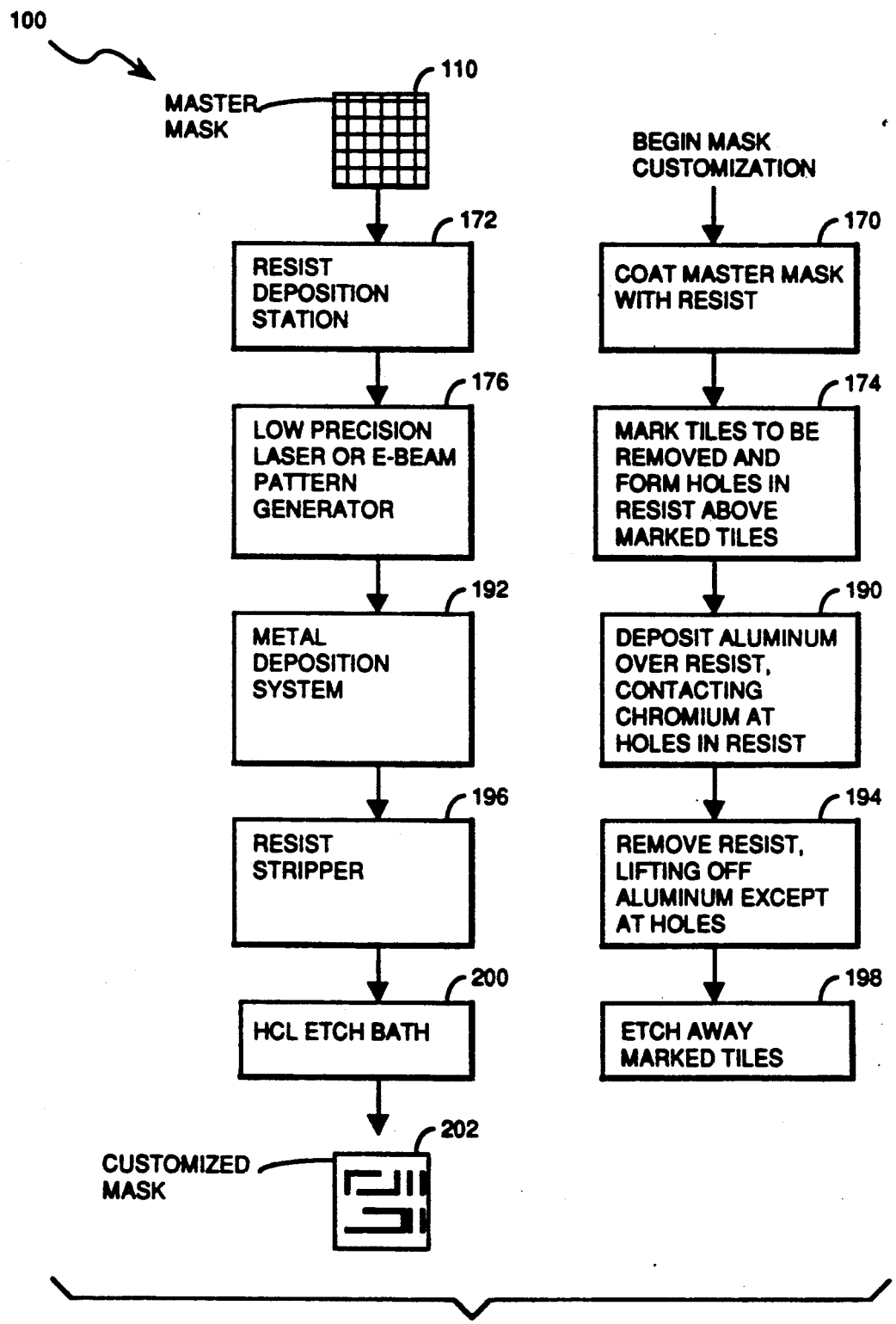
FIG. 4 is a combined flow chart and block diagram of a second embodiment of a system for customizing generic masks so as to generate custom masks.

Referring to FIG. 4, a second embodiment of a system for customizing generic masks is essentially a variation on the system and methodology shown in FIG. 3. The initial resist deposition and tile tagging steps of the customization process, steps 170 and 174, are the same as described above, resulting in a mask with a resist coating that has holes above the tiles to be removed.

Next, a layer of aluminum is deposited over the resist layer (step 190) using a metal deposition system 192. The deposited aluminum contacts the chromium tiles that have been tagged and exposed by the pattern generator 176. The resist layer is then removed (step 194) using standard resist stripping chemicals and equipment 196. This step lifts off the aluminum layer, except where it is attached to exposed chromium tiles. The resulting mask has an array of tiles, some of which are crowned with dots of aluminum. Unselected, unmarked tiles do not have aluminum dots.

The final step in the customization process is to etch away the marked tiles (step 198). This is typically done by immersing the mask in a hydrochloric acid bath 200. In HCL, only the chromium tiles in contact with an aluminum dot are etched away because of the electrochemical potential (or couple) existing at these tiles. Thus, the tiles marked with aluminum dots are etched completely away while the unmarked tiles remain unetched, leaving the resulting customized mask 202.

In another variation on this methodology, the tiles to be retained are tagged with copper dots, much as the tiles to be removed were tagged with aluminum dots above. Then an ceric ammonium nitrate etch is used to remove all the unmarked tiles, leaving only the tagged tiles.

DETAILED DESCRIPTION OF THIRD PREFERRED EMBODIMENT

Figure 5:
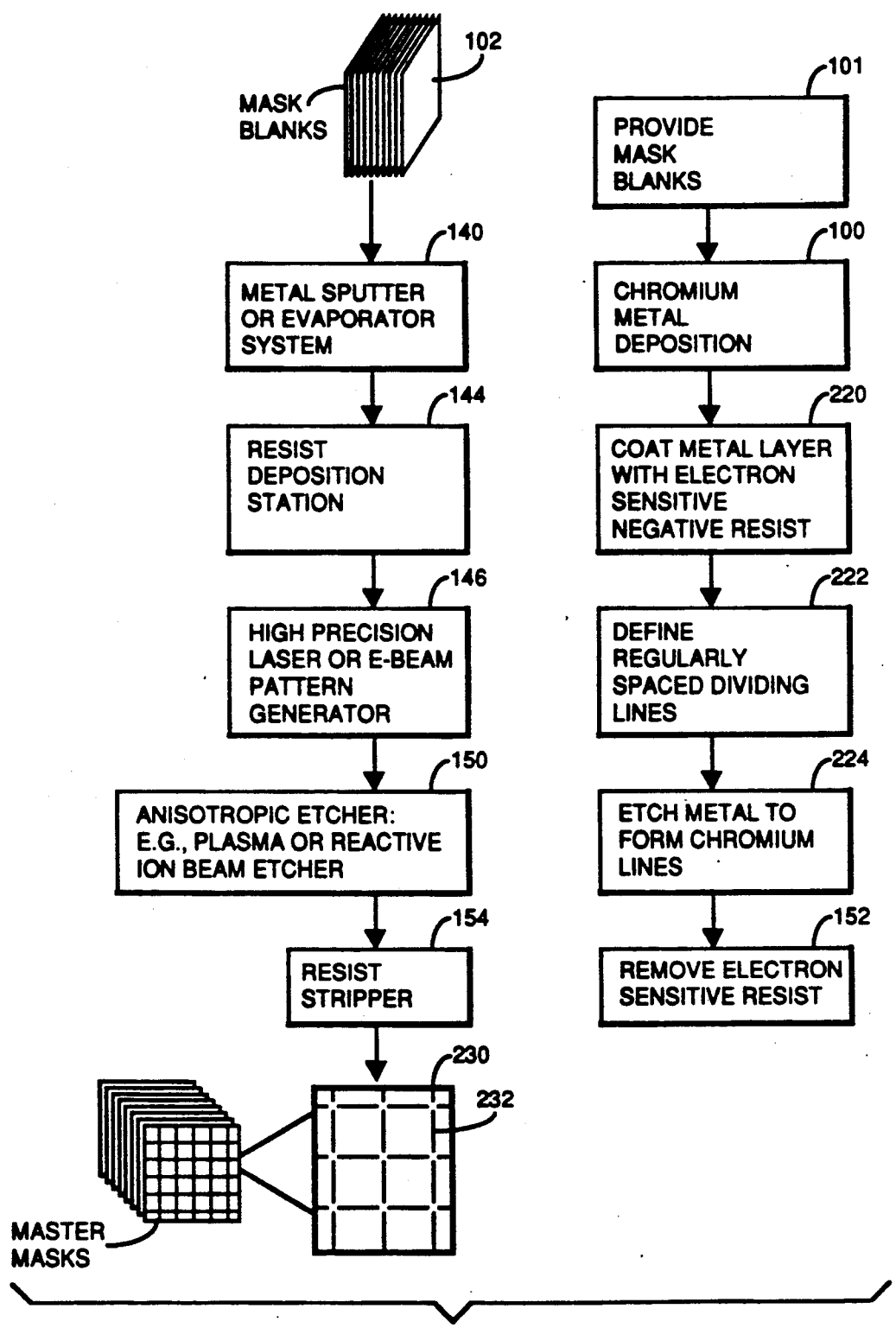
FIG. 5 is a combined flow chart and block diagram of a second embodiment of a system for manufacturing an alternate type of high precision generic mask.

Referring to FIG. 5, an alternate embodiment of the present invention produces generic master masks that are approximately equal to the negative of the master masks in the first embodiment. The equipment used in this embodiment is the same as that used in the first embodiment; only the methodology and patterning used are different. In particular, the chromium layer on the mask blank is coated with a negative resist (step 220) instead of a positive resist. Then regularly spaced dividing lines are defined (step 222) using a high precision pattern generator 146 such as an interferometric type scanning electron beam pattern generator. In this case, however, when the resist is developed, all the resist except for that above the dividing lines will be removed, because we are now using negative resist.

One other difference from the first embodiment is that the defined pattern of dividing lines preferably leaves small holes at each intersection of the dividing lines. Thus, the dividing lines are actually dividing line segments separated from one another by small holes. As will be described below, leaving a small hole at each intersection facilitates customization of the generic masks.

Next, an anisotropic etch is performed (step 224), leaving a generic mask 230 which comprises a set of chromium lines 232 which define an array of tile regions each of which is surrounded by these lines. Generating these generic masks 230 is no more difficult than manufacturing the generic masks provided by the first preferred embodiment.

Figure 6:
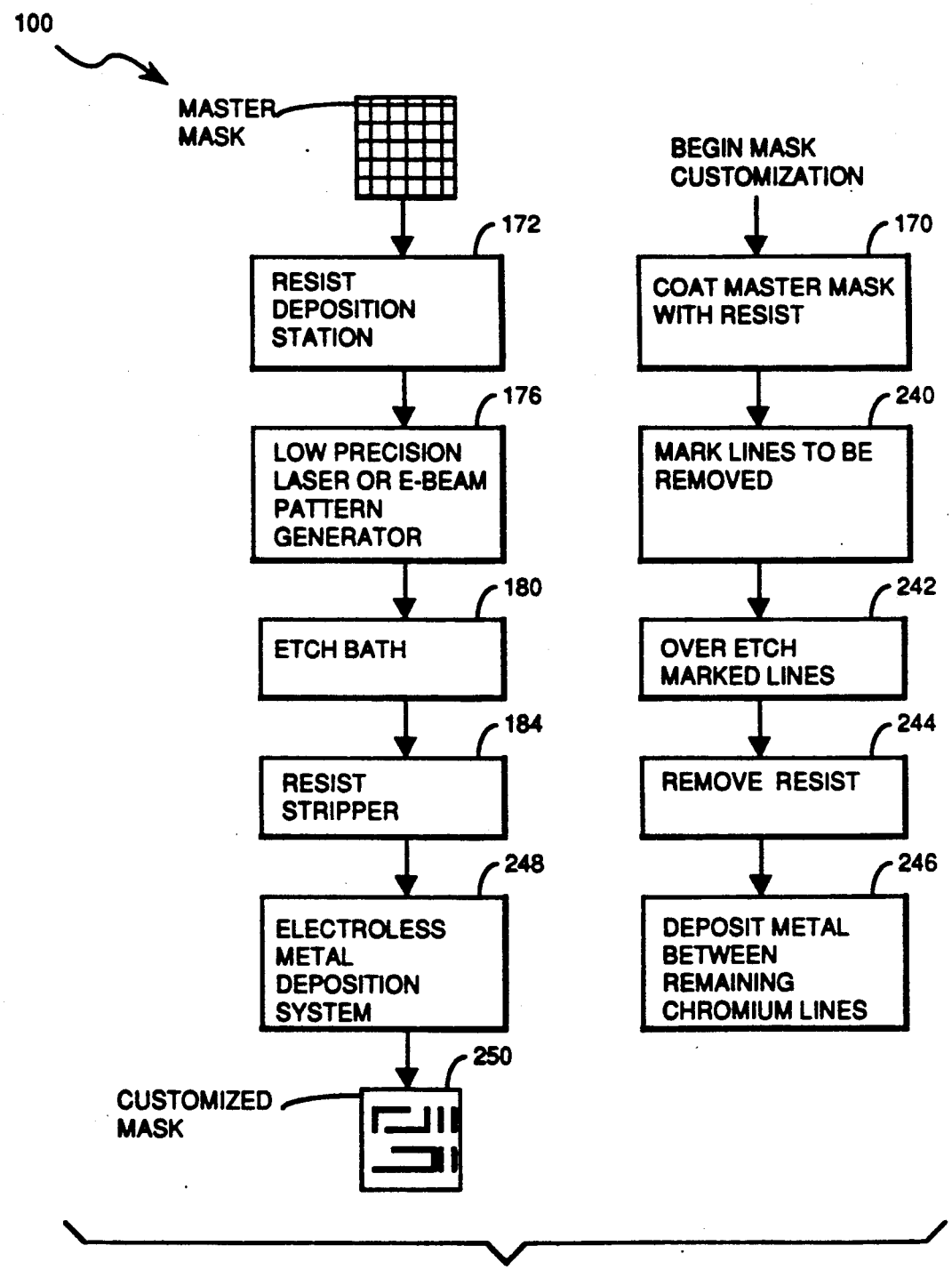
FIG. 6 is a combined flow chart and block diagram of a system for customizing the alternate type of generic masks manufactured using the system shown in FIG. 5.

Referring to FIG. 6, mask customization begins, as before, by coating the mask with resist (step 170) at a resist deposition station 172. Then the customized mask pattern is defined by marking those dividing lines to be removed (step 240), typically using a laser or a low-precision electron beam pattern generator 176. Note that the laser or electron beam pattern generator 176 need only make a hole in the resist which covers a part of each line to be removed. Next, the exposed dividing lines are overetched 242 in an etch bath 180, as described above, and then the remaining resist is removed (step 224) using standard resist stripping chemicals and equipment 184.

As can now be appreciated, leaving small holes at each dividing line intersection allows selected dividing line segments to be marked and then removed by overetching, without having to worry about unintentionally removing other dividing line segments.

Finally, metal (e.g., nickel) is deposited over those mask regions surrounded by the remaining chromium dividing lines (step 246) using an electroless metal deposition system 248. The resulting customized mask 250 has the same precisely located mask patterns as those generated using the other embodiments described above.

ALTERNATE EMBODIMENTS

The present invention can be used to generate precisely positioned patterns in other applications than semiconductor mask manufacturing. For instance, the quantum lithography methodology of the present invention could be used to generate somewhat thicker masks that could be used to mask X-rays.

A semiconductor manufacturing use of such X-ray masks would be to first form a customized "master" X-ray mask using the quantum lithography methodology of the present invention. Then the X-ray mask could be used to generate many duplicate masks, each containing a copy of that X-ray mask pattern, using X-ray lithography. These duplicate masks then would be used for semiconductor processing.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of patterning a thin film, the steps of the method comprising:
    forming a set of microscopically sized discrete thin film tiles in a periodic pattern on a substrate, each thin film tile covering a closed area of said substrate, said set of thin film tiles substantially covering an entire contiguous area of said substrate;
    selectively identifying a subset of said tiles; and
    removing said selected subset of tiles to form a pattern in said thin film layer.

2. The patterning method of claim 1,
    said forming step including forming precisely positioned microscopic dividing lines between said tiles, thereby precisely positioning said tiles so as to precisely position edges of said pattern formed by said removing step; wherein said microscopic dividing lines are positioned with a positioning accuracy characterized by a maximum misplacement which is less than 0.45 microns.

3. A method of patterning a thin film, the steps of the method comprising:
    depositing a thin film layer on a substrate;
    defining a set of precisely located dividing lines in said thin film layer, wherein said dividing lines have microscopic width and are spaced in accordance with a predefined coordinate system and intersecting so as to define microscopically sized tiles between said dividing lines, said tiles substantially covering an entire contiguous area of said substrate; and
    selectively identifying a subset of said tiles and removing said selected subset of tiles to form a pattern in said thin film layer, said pattern having precisely defined edges coinciding with ones of said microscopic width dividing lines.

4. The patterning method of claim 3,
    said selectively identifying step including the step of physically tagging all tiles which are to be retained, thereby identifying said subset of tiles which are to be removed, and then removing all tiles which are not tagged.

5. The patterning method of claim 3,
    said selectively identifying step including the step of physically tagging all tiles which are to be removed, thereby identifying said subset of tiles which are to be removed, and then removing all of said tagged tiles.

6. A method of patterning a thin film, the steps of the method comprising:
    providing a substrate;
    forming on said substrate a set of precisely located boundary lines, wherein said boundary lines are microscopic in width and are spaced in accordance with a predefined coordinate system and intersecting so as to define a periodic pattern of tiled regions of microscopic size between said boundary lines; and selectively depositing a thin film in a subset of said tiled regions to form a pattern on said substrate, said pattern having precisely defined edges coinciding with ones of said microscopic width boundary lines.

7. A method of patterning a thin film, the steps of the method comprising:

providing a generic thin film mask having a set of periodically positioned, microscopically sized discrete thin film tiles on a substrate each one of which covers a microscopic closed area of said substrate; said set of tiles covering a contiguous area of said substrate, except for dividing lines of microscopic width between said tiles;

selectively identifying a subset of said tiles; and removing said selected subset of tiles to form a pattern in said thin film mask.

8. The patterning method claim 7, said selectively identifying step including the step of physically tagging all tiles which are to be retained, thereby identifying said subset of tiles which are to be removed as all tiles which are not tagged, and then removing all tiles which are not tagged.

9. The patterning method of claim 7, said selectively identifying step including the step of physically tagging all tiles which are to be removed, thereby identifying said subset of tiles which are to be removed, and then removing all of said tagged tiles.

10. A method of patterning a thin film, the steps of the method comprising:

forming a set of microscopically sized discrete thin film tiles substantially covering an entire contiguous area of a substrate, each discrete thin film tile covering a closed area of said substrate, including forming trenches between said discrete thin film tiles, said trenches having a width which is less than a selected wavelength, wherein said selected wavelength is less than 0.45 microns;

selectively identifying a subset of said tiles; and removing said selected subset of tiles to form a pattern in said thin film layer, said selecting and removing steps including projecting a mask onto said set of discrete thin film tiles using light having said selected wavelength.

11. The patterning method of claim 10, said forming step precisely positioning said tiles so as to precisely position edges of said pattern formed by said removing step; wherein said trenches are positioned with a positioning accuracy characterized by a maximum misplacement which is less than said selected wavelength.

* * * * *